United States Patent
Heid

(10) Patent No.: US 6,686,739 B2
(45) Date of Patent: Feb. 3, 2004

(54) METHOD FOR OPERATING A MAGNETIC RESONANCE DEVICE FOR PRODUCING A MAGNETIC RESONANCE SPECTRUM

(75) Inventor: Oliver Heid, Gunzenhausen (DE)

(73) Assignee: Siemens Aktiengesellschaft, Münich (DE)

(*) Notice: Subject to any disclaimer, the term of this patent is extended or adjusted under 35 U.S.C. 154(b) by 0 days.

(21) Appl. No.: 09/804,803

(22) Filed: Mar. 13, 2001

(65) Prior Publication Data

US 2001/0022517 A1 Sep. 20, 2001

(30) Foreign Application Priority Data

Mar. 14, 2000 (DE) .......................... 100 12 278

(51) Int. Cl.⁷ ............................... G01V 3/00
(52) U.S. Cl. .................. 324/312; 324/310; 324/307
(58) Field of Search ................ 324/309, 307, 324/311, 312, 303, 306, 318, 310; 600/410; 342/25

(56) References Cited

U.S. PATENT DOCUMENTS

| | | | | |
|---|---|---|---|---|
| 5,105,152 A | * | 4/1992 | Pauly ........................... | 324/309 |
| 5,270,653 A | * | 12/1993 | Pauly ........................... | 324/309 |
| 5,459,401 A | | 10/1995 | Kiefer ........................... | 324/309 |
| 5,486,762 A | * | 1/1996 | Freedman et al. ........... | 324/303 |
| 5,742,163 A | * | 4/1998 | Liu et al. ...................... | 324/309 |
| 5,805,098 A | * | 9/1998 | McCorkle ..................... | 342/25 |
| 5,955,883 A | | 9/1999 | Hennig ......................... | 324/307 |
| 6,046,591 A | * | 4/2000 | King et al. ................... | 324/309 |
| 2001/0022517 A1 | * | 9/2001 | Heid ............................. | 324/312 |

FOREIGN PATENT DOCUMENTS

EP       0370138 B1  * 10/1994

OTHER PUBLICATIONS

"On the Use of Windows for Harmonic Analysis with the Discrete Fourier Transform," Harris, Proc. of the IEEE, vol. 66, No. 1, Jan., 1978 pp. 51–83.*
De Marco et al., article "Digital filtering with a sinusoidal window function: as an alternative technique for window enhancement in FT NMR" Journal of Magnetic Resonance, (1976), vol. 24(2), pp. 201–204.*
Webb et al., article "Volume–localized spectroscopy using selective Fourier Transform with windowing by variable–tip–angle excitation." Journal of Magnetic Resonance, (Aug. 1995) vol. 94, No. 1, p. 174–179.*
"On the Use of Windows for Harmonic Analysis with the Discrete Fourier Transform," Harris, Proc. of the IEEE, vol. 66, No. 1, Jan., 1978 pp. 51–83.
"Pulse And Fourier Transform NMR, Introduction to Theory and Methods," Farrar et al (1971) pp. 33, 75–76.

* cited by examiner

Primary Examiner—Diego Gutierrez
Assistant Examiner—Tiffany A. Fetzner
(74) Attorney, Agent, or Firm—Schiff Hardin & Waite

(57) ABSTRACT

In a method for operating a magnetic resonance device, a magnetic resonance signal is recorded over a span of time, and in order to produce a magnetic resonance spectrum, the magnetic resonance signal in the time domain is subjected to a Fourier transformation. The magnetic resonance signal is weighted with a bell-shaped window function before the Fourier transformation, thereby preventing broadening of resonance lines in the displayed frequency spectrum, so that non-dominant resonance lines, such as those associated with the metabolites, can be more readily analyzed.

18 Claims, 3 Drawing Sheets

METHOD FOR OPERATING A MAGNETIC RESONANCE DEVICE FOR PRODUCING A MAGNETIC RESONANCE SPECTRUM

BACKGROUND OF THE INVENTION

1. Field of the Invention

The present invention relates to a method for operating a magnetic resonance device in which a magnetic resonance signal is recorded for a span of time, and in which, in order to produce a magnetic resonance spectrum, the magnetic resonance signal in the time domain is subjected to a Fourier transformation.

2. Description of the Prior Art

Magnetic resonance spectroscopy has been used for more than four decades in basic research in physics, chemistry, and biochemistry, for example as an analytical technique or for the structural clarification of complex molecules. As is the case for magnetic resonance tomography, magnetic resonance spectroscopy is based on the principle of magnetic nuclear spin resonance. However, the primary goal of spectroscopy is not imaging, but rather an analysis of a material. Resonant frequencies of isotopes that have a magnetic moment, for example $^1$H, $^{13}$C, or $^{31}$P, are dependent on the chemical structure of molecules in which the above-named isotopes are bonded. A determination of the resonant frequencies therefore makes it possible to differentiate between different materials. The signal intensity at the various resonant frequencies provides information concerning a concentration of the corresponding molecules.

If a molecule is brought into a basic magnetic field of a magnetic resonance device, as takes place in spectroscopy, electrons of the molecule shield the basic magnetic field for atomic nuclei of the molecule. Due to this effect, the local magnetic field at the locus of an atomic nucleus changes by a few millionths of the external basic magnetic field. The accompanying variation of the resonant frequency of this atomic nucleus is called chemical displacement. In this way, molecules can be identified on the basis of their chemical displacement. Since, from the point of view of measurement technology, frequency differences can be acquired more easily and more precisely than can absolute frequencies, the chemical displacement is indicated in ppm relative to a reference signal, for example the operating frequency of the magnetic resonance device.

A resonance line of an atomic nucleus can be split into a number of lines if additional atomic nuclei having a magnetic moment are located in the environment of the atomic nucleus under observation. The cause for this is due to the phenomenon known as spin-spin coupling between the atomic nuclei. The magnetic flux density of the basic magnetic field that is experienced by an atomic nucleus depends not only on the electron shell surrounding this atomic nucleus, but also on the orientation of the magnetic fields of the neighboring atoms. Because the resolution capacity of the magnetic resonance device is often too low, the spin-spin coupling is thereby often not visible in the spectra.

Clinical magnetic resonance spectroscopy is understood to refer to magnetic resonance spectroscopy with the use of clinical magnetic resonance tomography devices. The methods used in localized magnetic resonance spectroscopy are distinguished from those used in magnetic resonance imaging essentially by virtue of the fact that in spectroscopy, in addition to the tomographic locus resolution, chemical displacement is resolved.

Currently, in clinical applications two types of localization methods for magnetic resonance spectroscopy are dominant. A first type includes individual volume techniques based on echo methods, in which a spectrum of a target volume selected beforehand on the basis of proton images is recorded. A second type includes spectroscopic imaging methods (Chemical Shift Imaging, CSI) that simultaneously enable the recording of spectra of a multiplicity of spatially contiguous target volumes.

The individual volume techniques standardly used today are based on acquisition of a stimulated echo or of a secondary spin echo. In both cases, a locus resolution takes place through successive selective excitations of three orthogonal layers. The target volume is defined by the slice volume of these three layers. Only the magnetization of the target volume experiences all three selective high-frequency pulses and thus contributes to the stimulated, or secondary spin echo. The spectra of the target volume is obtained through one-dimensional Fourier transformation of a time signal corresponding to the stimulated echo, or to the secondary spin echo.

Spectroscopic imaging methods are used both in clinical phosphorus spectroscopy and in proton spectroscopy. A 3D CSI pulse sequence includes for example the following steps: After a slice-layer-selective 90° high-frequency pulse, for a defined period of time a combination of magnetic phase coding gradients of the three spatial directions is activated, and subsequently the magnetic resonance signal is read out in the absence of all gradients. This procedure is repeated as often as necessary with different combinations of phase coding gradients until the desired locus resolution has been achieved. A four-dimensional Fourier transformation of the magnetic resonance signals supplies the desired spatial distribution of the resonance lines. If the above-described non-selective high-frequency pulse is replaced by a slice-selective excitation, consisting of a frequency-selective high-frequency pulse and a corresponding magnetic gradient, one phase coding direction can be omitted, and given a 2D CSI pulse sequence of this sort the measurement time is reduced in relation to the 3D CSI pulse sequence.

In clinical proton spectroscopy, the intensive water signals are often suppressed using so-called water suppression methods. A method for water suppression is, for example, the CHESS technique, in which the nuclear spins of the water molecules are first selectively excited by narrowband 90° high-frequency pulses, and their cross-magnetization is subsequently de-phased through the switching of magnetic field gradients. For an immediately subsequent spectroscopic imaging method, in the ideal case no detectable magnetization of the water molecules is therefore available. In methods using water suppression, however, metabolites are at least partially also saturated, so that, disadvantageously, these metabolites contribute only slightly, or not at all, to a magnetic resonance signal, and appear only weakly, or not at all, in the associated spectrum.

In the above-described individual volume techniques and spectroscopic imaging methods, magnetic resonance signals of a particular chronological length, for example a free induction decay or a second half of a spin echo, are subjected to a Fourier transformation, as a part of a very comprehensive procedure—from the point of view of magnetic resonance physics—for the production of a spectrum. Among other things, this results in the resonance lines, in particular the water resonance lines, of a spectrum experiencing an undesired line broadening, so that metabolite resonance lines adjacent to the water resonance line are covered due to the broadening, and, in addition, a precise frequency determination in particular of metabolite resonance lines, and thereby the identification thereof as particular molecules, is made more difficult.

SUMMARY OF THE INVENTION

An object of the present invention is to provide a method of the type described above for the operation of a magnetic resonance device that reduces the cited disadvantages of the prior art.

The above object is achieved in accordance with the principles of the present invention in a method for operating a magnetic resonance device, wherein a magnetic resonance signal is recorded for a time span and wherein, in order to produce a magnetic resonance spectrum, the magnetic resonance signal in the time domain is subjected to a Fourier transformation, and wherein, before the Fourier transformation, the magnetic resonance signal is weighted with a bell-shaped window function.

Due to the fact that before the Fourier transformation the magnetic resonance signal is weighted with a bell-shaped window function, a line broadening of resonance lines is prevented. Frequencies, in particular of non-dominant resonance lines, can thereby be precisely determined, so that an unambiguous identification of the associated materials is enabled. A bell-shaped window function is a function that for all times outside a window width, it has the value zero, and inside the window width it has a bell-shaped curve having values different from zero.

In one embodiment, the bell-shaped window function is a symmetrical window function, for example a Hanning window function. The bell-shaped curve of the symmetrical window function is mirror-symmetric to an axis running through a midpoint of the window width. In additional embodiment, other bell-shaped window functions can be used, such as are for example described in the article by F. J. Harris, "On the Use of Windows for Harmonic Analysis with the Discrete Fourier Transform," Proceedings of the IEEE, vol. 66, no. 1, January 1978, pp. 51–83. Here reference is made to the fact that the rectangular window function does not present a bell-shaped window function.

In another embodiment, the magnetic resonance signal is recorded free from a suppression of a dominant resonance line. Due to the fact that in the inventive method no line broadening of the dominant resonance line takes place, none of the non-dominant resonance lines adjacent to the dominant resonance line are covered by a broadened dominant resonance line, so that the above-cited suppression can be omitted, which suppression is known to have the disadvantage that, besides the dominant resonance line, adjacent non-dominant resonance lines are also at least partially suppressed.

In a specific embodiment of the invention, the magnetic resonance signal recorded for the span of time is present in the form of a discrete data set, for example stored in a computer system of the magnetic resonance device. For the production of the spectrum, the Fourier transformation is thereby applied to the discrete data set as a discrete Fourier transformation, for example as a fast Fourier transformation (FFT). The discrete data set is thereby weighted, before the Fourier transformation, with a discrete bell-shaped window function, such discrete window functions being produced by discretely dividing comparable time-continuous window functions.

In a further embodiment, the recording of the magnetic resonance signal is started at the earliest possible point in the time sequence of a sequence generating the magnetic resonance signal. In this way, in particular given a spin echo signal, as far as is technically possible signal portions are also recorded that chronologically precede a maximal signal level, whereby, among other things, the signal-noise ratio is improved. For this purpose, in a further embodiment the magnetic resonance signal of a spin echo is recorded symmetrically around a spin echo time point.

In another embodiment, the time span is divided into time segments, the magnetic resonance signal of at least one of the time segments is weighted with an additional bell-shaped window function. The additional window function has an additional window width that is approximately equal to the time segment. The additional window width is placed into a region of the (at least one) time segment. The magnetic resonance signal weighted with the additional window function is subjected to an additional Fourier transformation. At least one non-dominant resonance line is made more precise or defined. In addition, in a further version the time segment is selected from an initial region of the time span. In this way, non-dominant resonance lines are made more precise in their amplitude and frequency, these lines being recorded only at the beginning of the time span due to their short decay time, and experiencing a strong suppression due to the window function.

DESCRIPTION OF THE PREFERRED EMBODIMENTS

Figure 1:
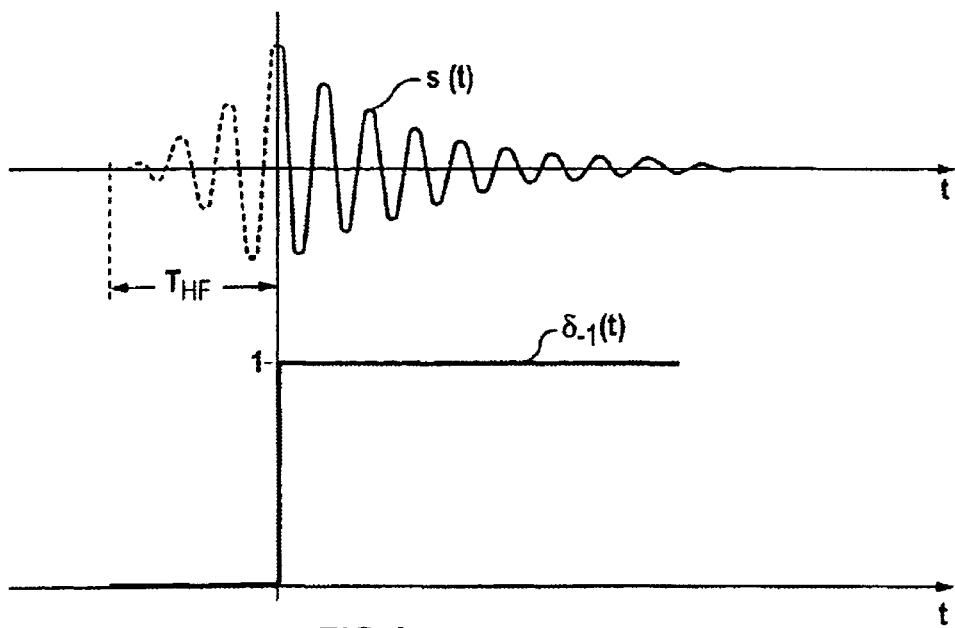
FIG. 1 illustrates a magnetic resonance signal as well as the further treatment thereof according to the prior art.

FIG. 1 shows a magnetic resonance signal s(t) that, for example, is a free induction decay signal. During a high-frequency excitation time duration $T_{HF}$, it is not possible for the equipment to make a simultaneous recording of the magnetic resonance signal s(t), so that the magnetic resonance signal s(t) multiplied by a unit step $\delta_{-1}(t)$—i.e., the actual free induction decay—is available for a further treatment. The magnetic resonance signal s(t) is thereby shown by a dotted line during the high frequency excitation time duration $T_{HF}$, and is shown with a solid line for the rest of the time curve. The magnetic resonance signal s(t) is obtained, for example, from a $^1H$ spectroscopy method using a single-volume technique without water suppression. The free induction decay signal, or in other words the result of the multiplication of the magnetic resonance signal s(t) by the unit step $\delta_{-1}(t)$, is Fourier-transformed in order to form a spectrum. Through the Fourier transformation, the above-cited multiplication is thereby transformed into a convolution between the Fourier transform $S(j\omega)$ of the magnetic resonance signal s(t) and the Fourier transform of the unit step $\delta_{-1}(t)$, which is equal to $1/(j\omega)$. Through the convolution of the Fourier transform $S(j\omega)$ with $1/(j\omega)$, a superposition of the spectrum takes place. This leads in particular to a broadening of the dominant water resonance line, so that this line can cover non-dominant metabolite resonance lines that border on or are adjacent to the water resonance line. In addition, a computer-supported correction of the spectrum by means of a subsequent calculating out of the convolution with 1/(jω) is always imprecise for apparatus-related reasons, for example as a result of influences from eddy currents.

Figure 2:
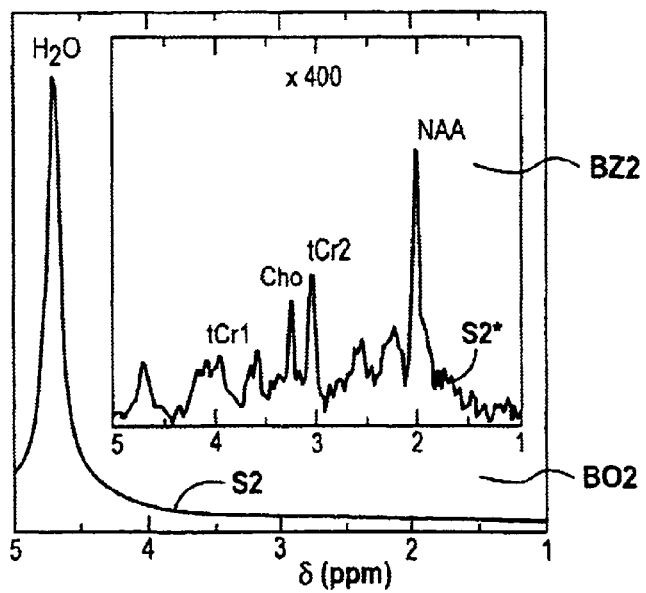
FIG. 2 shows a magnetic resonance spectrum according to the prior art.

FIG. 2 shows a magnetic resonance spectrum S2 that results, for example, from the Fourier transformation specified for FIG. 1. In the non-zoomed image area BO2 of FIG. 2, the spectrum S2 is clearly dominated by the water resonance line $H_2O$. The zoomed image segment BZ2 of FIG. 2 shows—after computer-supported removal of spectral drifts of the water resonance line $H_2O$, for example by a signal adaptation in the time domain—the spectrum S2*, which is shown with amplitude amplified 400 times in relation to the spectrum S2. Here it can be seen that due to a cumulative residual signal of the water, the metabolite resonance line tCr1 adjacent to the water resonance line $H_2O$ has no pronounced line peaks, and has an indefinitely broad line base, so that an unambiguous frequency allocation, and thereby an identification as a metabolite resonance line, is made difficult or is completely prevented.

Figure 3:
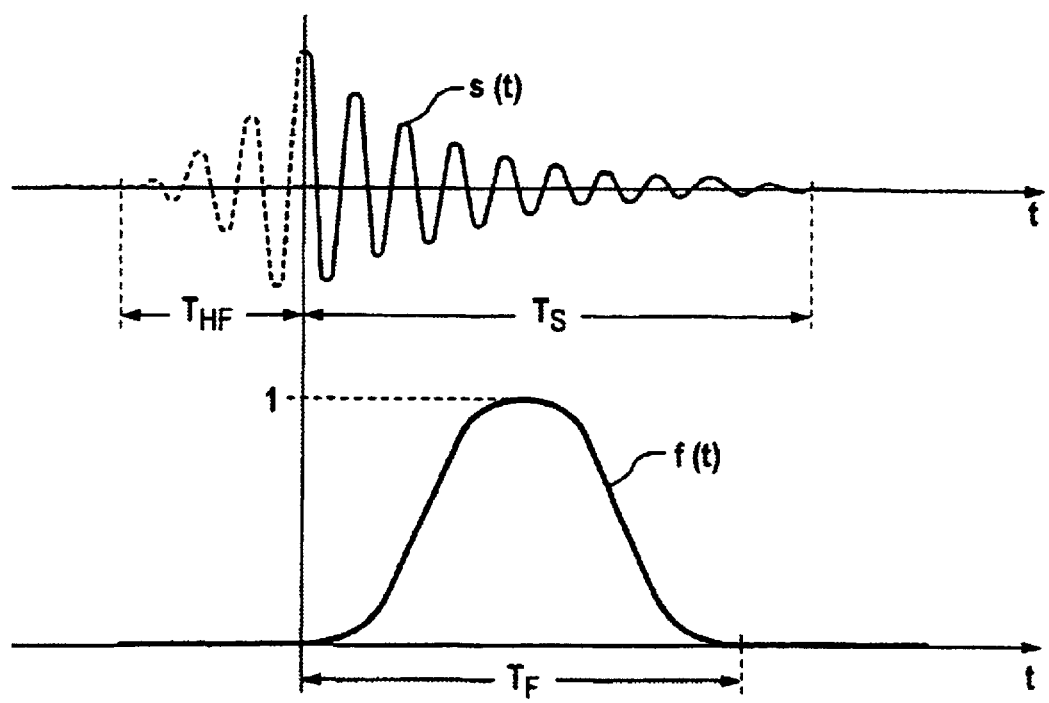
FIG. 3 illustrates a magnetic resonance signal and the further treatment thereof using a bell-shaped window function in accordance with the inventive method.

FIG. 3 again shows, as an exemplary embodiment of the invention, the magnetic resonance signal s(t), recorded for a time span $T_s$, again following an excitation time duration $T_{HF}$. Before an execution of a Fourier transformation in order to produce a magnetic resonance spectrum, the magnetic resonance signal s(t) is weighted with a bell-shaped window function f(t) that has a window width $T_F$, i.e., the magnetic resonance signal s(t) is multiplied by the window function f(t). The window function f(t) is, for example, a Hanning window function. In other embodiments, other window functions, for example the Kaiser-Bessel window function, can be used. Care should be taken that a periodic continuation of the magnetic resonance signal s(t) having window width $T_F$, and weighted with the window function f(t), always makes a continuous or smooth transition at the ends of the window width $T_F$, and/or has the value zero.

Figure 4:
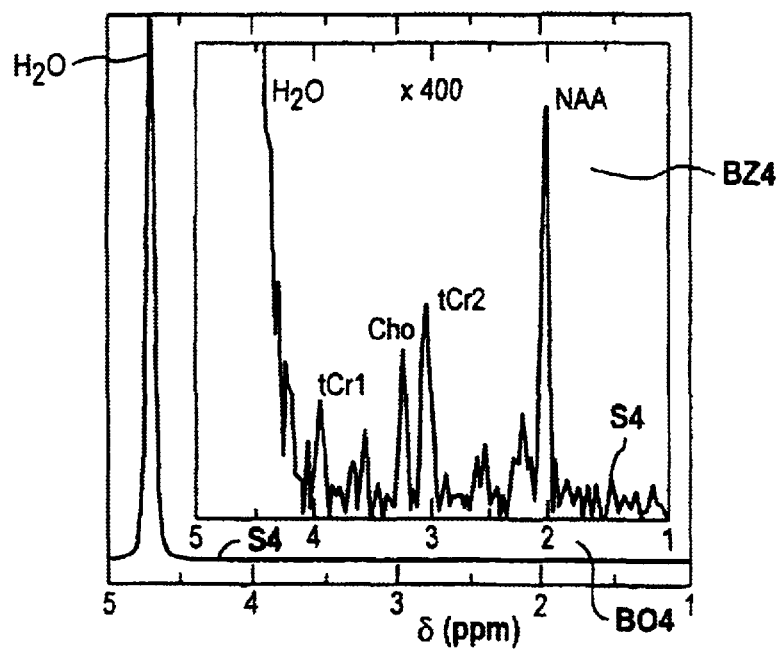
FIG. 4 shows a magnetic resonance spectrum of a magnetic resonance signal weighted using a bell-shaped window function, in accordance with the inventive method.

FIG. 4 shows, as an exemplary embodiment of the invention, a spectrum S4 that is produced for example by Fourier transformation of the magnetic resonance signal s(t) weighted with the window function f(t). In the non-zoomed image region BO4 of FIG. 4, the spectrum S4 is thereby again clearly dominated by the water resonance line $H_2O$. In relation to FIG. 2, however, the water resonance line $H_2O$ exhibits no line broadening. In the zoomed image region BZ4 of FIG. 4, the spectrum S4 is shown with amplitude amplified 400 times, whereby, in contrast to the amplitude-magnified spectrum S2* of FIG. 2, no attempt is made to remove spectral drifts of the water resonance line $H_2O$. In contrast to FIG. 2, the metabolite resonance line tCr1 is characterized by a comparatively small line width and a low degree of spreading so that, as a result of an unambiguous frequency allocation, the metabolite can be identified, and, due to the clear line amplitude, the metabolite concentration in the volume element can be unambiguously determined.

Figure 5:
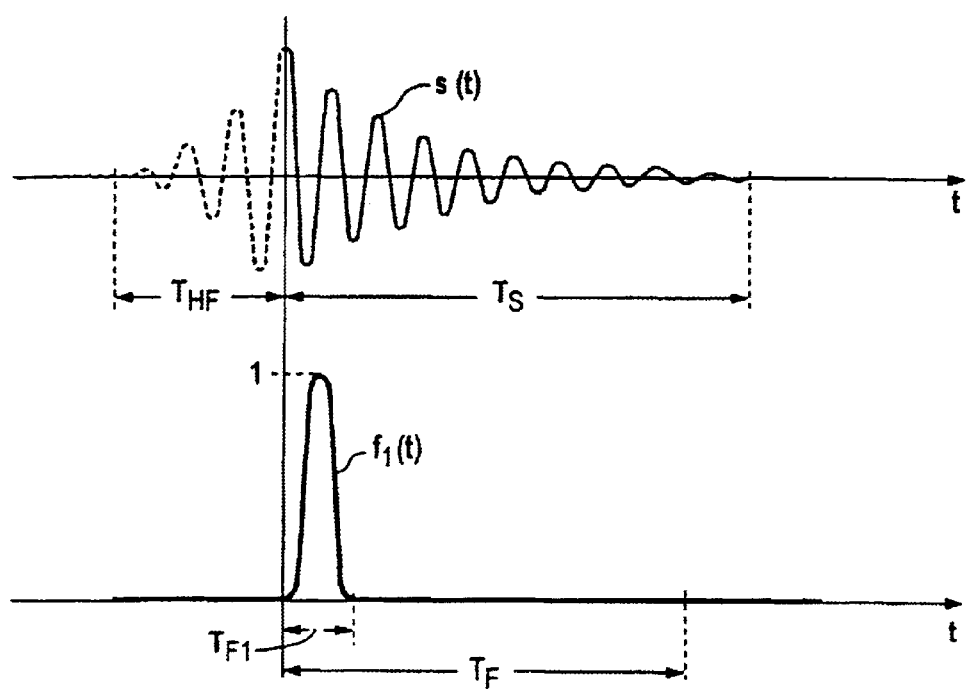
FIG. 5 illustrates a magnetic resonance signal and the further treatment thereof for producing precise resonance lines in accordance with the inventive method.

FIG. 5 again shows, as an exemplary embodiment of the invention, the magnetic resonance signal s(t), recorded for the time span $T_s$. In order to make metabolite resonance lines more precise with respect to frequency and amplitude, the magnetic resonance signal s(t) is multiplied by an additional bell-shaped window function $f_1(t)$ having a window width $T_{F1}$. The window width $T_{F1}$ is thereby a time segment of the above-cited window width $T_F$, and is placed into an initial region in the time sequence thereof. Using the Fourier transform of the magnetic resonance signal s(t) weighted with the window function $f_1(t)$, metabolite resonance lines, in particular are made more precise that, due to their short decay time, were recorded only at the beginning of the time span $T_s$, and that experience a strong suppression due to the window function f(t). In addition, given a repetition of the above-cited weighting for other time segments with additional window functions corresponding to the window function $f_1(t)$, statements can be made concerning decay rates of individual resonance lines through a comparison of line amplitudes of the individual Fourier transforms.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance apparatus, comprising the steps of:
    recording a magnetic resonance signal for a time span comprised of a plurality of time segments and thereby receiving a recorded magnetic resonance signal having a signal segment respectively in each of said time segments;
    after receiving said recorded magnetic resonance signal, weighting said recorded magnetic resonance signal with a bell-shaped window function to obtain a weighted magnetic resonance signal;
    Fourier transforming said weighted magnetic resonance signal only after said weighting, to produce a magnetic resonance spectrum;
    weighting at least one of said magnetic resonance signal segments respectively recorded in at least one of said time segments with an additional bell-shaped window function having a window width that is approximately equal to, and disposed within, said at least one of said time segments, to obtain an additionally-weighted segment of said magnetic resonance signal; and
    subjecting said additionally-weighted segment of magnetic resonance signal to an additional Fourier transformation, to make at least one non-dominant resonant line in said magnetic resonance signal more precise.

2. A method as claimed in claim 1 comprising recording said magnetic resonance signal without suppression of a dominant resonant line.

3. A method as claimed in claim 1 comprising recording said magnetic resonance signal during a free induction decay.

4. A method as claimed in claim 1 comprising recording said magnetic resonance signal during a spin echo.

5. A method as claimed in claim 4 comprising recording said magnetic resonance signal symmetrically relative to a spin echo time point.

6. A method as claimed in claim 1 comprising recording said magnetic resonance signal using a recording sequence, and starting recording of said magnetic resonance signal at an earliest possible point in time in said sequence.

7. A method as claimed in claim 1 comprising weighting said magnetic resonance signal with a window function having a window width which is less than or equal to said time span.

8. A method as claimed in claim 7 wherein said window width of said window function is a chronological portion of said time span.

9. A method as claimed in claim 7 wherein said time span has a beginning, and wherein said window width of said window function starts at said beginning of said time span.

10. A method as claimed in claim 1 wherein said time span has an initial region, and comprising selecting said at least one of said time segments from said initial region.

11. A method as claimed in claim 1 comprising selecting said additional window function so that said additionally weighted segment of magnetic resonance signal is 0 at opposite ends of the window width of said additional window function.

12. A method as claimed in claim 1 wherein said window function has a window width, and comprising selecting said window function so that said weighted magnetic resonance signal is 0 at opposite ends of the window width of said window function, and selecting said additional window function so that said additionally weighted segment of said magnetic resonance signal is 0 at opposite ends of the window width of said additional window function.

13. A method as claimed in claim 1 comprising selecting said additional window function so that a periodic continuation of said additionally segment of said weighted magnetic resonance signal makes a continuous transition at opposite ends of said window width of said additional window function.

14. A method as claimed in claim 1 wherein said window function has a window width, and comprising selecting said window function so that a periodic continuation of said weighted magnetic resonance signal makes a continuous transition at opposite ends of said window width of said window function, and selecting said additional window function so that a periodic continuation of said additionally weighted segment of said magnetic resonance signal makes a continuous transition at opposite ends of said window width of said additional window function.

15. A method as claimed in claim 1 comprising selecting at least one of said window function and said add additional window function as a symmetrical window function.

16. A method as claimed in claim 1 comprising conducting at least one of said Fourier transformation and said additional Fourier transformation using a fast Fourier transform.

17. A method as claimed in claim 1 wherein said window function has a window width, and comprising selecting said window function so that said weighted magnetic resonance signal is 0 at opposite ends of said window width.

18. A method as claimed in claim 1 wherein said window function has a window width, and comprising selecting said window function so that a periodic continuation of said weighted magnetic resonance signal makes a continuous transition at opposite ends of said window width.

* * * * *